United States Patent [19]

Muchkin et al.

[11] 4,396,819
[45] Aug. 2, 1983

[54] METHOD OF FORMING A CONDUCTIVE CONNECTION

[76] Inventors: Vadim V. Muchkin, ulitsa Mezhdunarodnaya, 20, kv. 30; Georgy I. Kuzmichev, ulitsa Shelkovichnaya, 182, kv. 74, both of Saratov; Emil V. Bumbieris, prospekt Kirova, 21, kv. 6, Riga, all of U.S.S.R.

[21] Appl. No.: 298,321

[22] Filed: Sep. 1, 1981

[51] Int. Cl.[3] .............................................. B23K 13/00
[52] U.S. Cl. ................................... 219/91.21; 219/56; 219/91.22; 219/92; 219/840; 219/860
[58] Field of Search .............. 219/56.21, 56.22, 78.01, 219/78.02, 78.14, 86.7, 91.2, 91.21, 91.22, 92; 29/597, 840, 850, 860; 228/180 A, 179, 4.5, 239

[56] References Cited

U.S. PATENT DOCUMENTS 3,263,059  7/1966  Rzant .............................. 219/91.21
3,673,689  4/1972  Sterenko.

Primary Examiner—B. A. Reynolds
Assistant Examiner—Catherine Sigda
Attorney, Agent, or Firm—Murray Schaffer

[57] ABSTRACT

A method of forming a conductive connection between predominantly miniature members by pressing the members together and heating by means of electrodes through which three successive pulses of electric current are passed. First and second pulses act to break a flowable insulation coating of one of the members, melt a solder alloy in the location of the connection and effect a weld, while a third current pulse is applied to the electrodes prior to their raising from the members to thereby melt the solder alloy and flowable insulation coating, whereafter the electrodes are withdrawn from the members and the third current pulse is quenched.

1 Claim, 5 Drawing Figures

METHOD OF FORMING A CONDUCTIVE CONNECTION

FIELD OF THE INVENTION

The present invention relates to the art of microwelding and soldering associated with instrument making, and more particularly to methods of forming conductive mechanical connections.

The invention can find application in making conductive connections between insulated conductors and terminal pads of printed circuit boards by employing such welding techniques as resistance welding, thermocompression welding, as well as by simultaneous welding and brazing or welding and soldering.

BACKGROUND OF THE INVENTION

There is known a method for connecting a conductor enclosed by a flowable insulation to a copper terminal pin coated with a tin-lead alloy (cf., U.S. Pat. No. 3,627,970, published 1971), whereby a conductive connection is formed through heating a point by a heated tip of a tubular electrode. However, such a connection involves soldering and the above method fails to provide successive connection of more than one conductors to the same terminal pin in close proximity to one another.

Also known is a method for connecting an insulated conductor to terminal pins of a printed circuit board (cf., U.S. Pat. No. 3,673,681, published 1972), whereby an insulated conductor is connected by resistance welding involving one pulse of welding current to be passed therethrough. The insulation of the conductor is pressure-deformable by the electrode. A disadvantage of this method resides in the use of high-cost nickel conductors and gold-plated stainless steel terminal pins; it is also very labor-consuming.

Further known is a method of forming a connection between members coated with flowable insulation, whereby the members are pressed together by the electrodes followed by the application of three current pulses through the electrodes. The first pulse acts to melt the insulation, the second pulse effects a weld between the members, and the third pulse effects a cleaning action, the third pulse being triggered and quenched subsequent to raising the electrodes from the welded members to clean the electrodes of the flowable insulation (cf., U.S. Pat. No. 3,263,059, application filed 1963).

Inherent in the above method is a disadvantage in that the edges of the thus formed weld are covered with sharp clusters of solidified flowable insulation extending upwards from the surface of the welded members and affecting the accuracy of alignment in connecting subsequent members thereto. In addition, the method provides a relatively low strength of such welded couples as copper terminal pin-insulated copper wire, amounting only to about 20-25% of the strength of the insulated wire.

The sharp clusters of flowable insulation are formed due to raising the electrodes at a point when the temperature of the electrodes and the members being welded is substantially less than the melt point of the flowable insulation. This occurs after the second current pulse is passed and subsequent to a dwell time necessary for completing the weld.

SUMMARY OF THE INVENTION

It is an object of the present invention to increase the mechanical strength and improve the corrosive resistance of a conductive connection.

The object is attained by that in a method of forming a conductive connection between predominantly miniature members, at least one of which is coated with a flowable insulation, by pressing the members together and heating by means of electrodes through which three successive pulses of electric current are passed, the first current acting to break the flowable insulation coating of one of the members, the second current pulse effecting a weld, and the third current pulse acting to clean the electrodes of the flowable insulation coating, the latter current pulse being quenched subsequent to raising the electrodes from the welded members and cleaning, according to the invention, a solder alloy is introduced into the weld joint, whereas the third current pulse is applied to the electrodes prior to their raising from the members, the members being heated to a temperature exceeding that of the melt points of the solder alloy and the flowable insulation coating thereby causing the solder alloy and the flowable insulation coating adjoining the weld joint to melt, the electrodes being withdrawn from direct contact with the members being welded, the solder alloy and the flowable insulation coating at a point when the solder alloy and the flowable insulation coating are still in a melted state.

The invention makes it possible to carry out a new method of wiring an electric circuit on standard dielectric prefabricated printed circuit boards having tin-lead alloy coated copper terminal pads to which are weld-soldered insulated copper conductors without affecting adhesion of the terminal pads to the boards; the method provides for making consequitive conductive connections between a terminal pin and two or even more conductors.

BRIEF DESCRIPTION OF THE DRAWINGS

The foregoing features of the invention will be more fully apparent from the following detailed description of a preferred embodiment thereof with reference to and as illustrated in the accompanying drawings, in which.

DETAILED DESCRIPTON OF THE INVENTION

Figure 1:
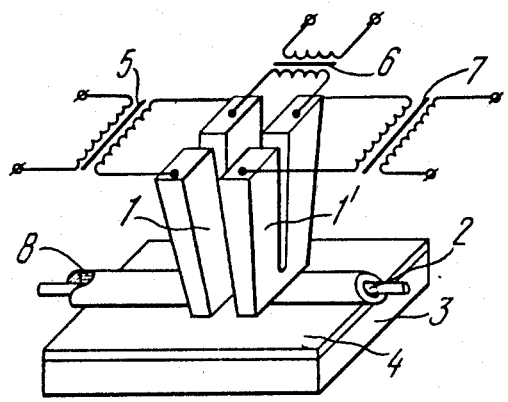
FIG. 1 is a schematic of a preferred embodiment of a welder for carrying out a method of forming a conductive connection according to the invention.

With reference to FIG. 1, a pair of V-shaped electrodes 1 and 1' are arranged in a spaced relationship on one connectable member, viz. conductor 2, coated with a flowable insulation 8 and resting on another connectable member, viz. board 3. Soder alloy 4 may have the form of a tin-lead alloy coating or be introduced as a filler rod.

The electrodes 1 and 1' are electrically connected to welding transformers 5, 6 and 7. In order to carry out the method according to the invention, use is made of connectable members in the form of a 0.1 mm dia copper wire coated with an insulation meltable at 360° C. and copper terminal pads installed on prefabricated printed circuit boards having a tin-lead alloy coating of 20–25 mkm in thickness and a melt point of 183° C., the terminal pads measuring 1.8 by 2.8 by 0.05 mm.

Conventional molybdenum V-shaped electrodes were employed as the electrodes 1 and 1' spaced from one another a distance of 0.1 mm, the lower end face of each electrode measuring 0.3 by 0.8 mm. Each of the electrodes 1 and 1' is connected separately to the transformers 5 and 7, respectively, while both electrodes 1 and 1' are connected to the common transformer 6.

A program control unit (not shown) is provided adjusted in a manner such that the application of a third current pulse to heat the electrodes 1 and 1' is effected prior to the withdrawal of the electrodes 1 and 1' from the members 2 and 3, the third current pulse being quenched subsequent to the withdrawal of the electrodes 1 and 1' from the member 2 and the interruption of a conductive path between the electrodes 1 and 1' and the members 2 and 3.

The power of the current pulse was selected such that by the time of the withdrawal of the electrodes 1 and 1' from the members 2 and 3 the temperature of the lower end faces of the electrodes 1 and 1' would amount to 1.5 values of the melt point of the most high-melting of the coatings (i.e. approx. 540° C.).

The process of forming a conductive connection according to the method of the invention envolves the following operating sequences. Subsequent to the placement of the conductor under the electrodes 1 and 1' and compression thereof against the terminal pad of the board with a compressive force of 2.5 N, a first current pulse of 20 ms duration and 0.5 J energy is made to pass from the transformers 5 and 7 through the V-shaped electrodes. Under the action of this current pulse the lower end faces of the electrodes 1 and 1' are heated to a temperature in excess of the melt point of the flowable insulation coating.

Figure 2:
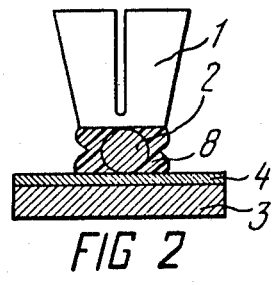
FIG. 2 is a sectional elevation of connectable members subsequent to the passage of a first current pulse through electrodes acting to brake a flowable insulation coating of one of the members.

Each of the heated electrodes 1 and 1' is then pressed against the flowable insulation coating 8 (FIG. 2) to heat it and force out the coating 8 and the solder alloy 4 from under the conductor until a conductive connection is formed between the conductor and the terminal pad of the board. This is followed by the application of a second current pulse from the transformer 6 (pulse duration-20 ms; energy-0.7 J) to the thus formed conductive path including the electrodes 1 and 1' and the members 2 and 3 (conductor and terminal pad, respectively), thereby heating the localized portion of the members between the electrodes 1 and 1' to a temperature of between 750° C. and 800° C. to form a weld joint between the conductor and the terminal pad of the board. The solder alloy 4 is forced out from under the conductor both by virtue of the application of the first current pulse and the second current pulse, depending on their energy value.

Figure 4:
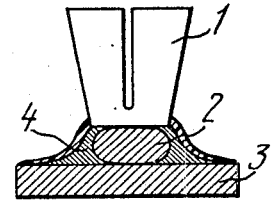
FIG. 4 is a sectional elevation of the connectable members subsequent to the application of a third current pulse to the electrodes and prior to raising the electrodes from the connectable members.
Figure 3:
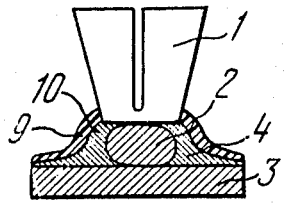
FIG. 3 is a sectional elevation of the connectable members subsequent to the passage of a second current pulse through the electrodes effecting a weld.
Figure 5:
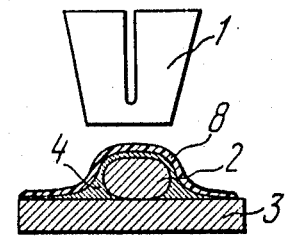
FIG. 5 is a view of the formed conductive connection after the electrodes have been withdrawn therefrom.

Thereafter, the third pulse of current is made to pass from the transformers 5 and 7 through the electrodes 1 and 1', respectively (duration of the pulse-40 ms; energy-1 J), to heat the electrodes 1 and 1' and melt both the solder alloy 4 and the flowable insulation coating 8. After some time (viz. 5 ms) required to heat the lower end faces of the electrodes 1 and 1' to a temperature normally exceeding by 50° to 100° C. the melt points of the most hard-to-melt flowable insulation coating 8 or the solder alloy 4, a signal is conveyed to raise the electrodes 1 and 1'; the application of heat being continued in the course of raising whereby projections or surface irregularities 9 and 10 (FIG. 3) consisting of and formed in the location of the connection of the members 2 and 3 from the flowable insulation coating 8 and the solder alloy 4, respectively, are caused to melt and flow on the member 2 (FIG. 4) together with some of the flowable insulation coating 8 and the solder alloy 4 adhered to the electrodes 1 and 1' and melted thereon, which results in that an exposed portion of the conductor (FIG. 5) tends to be closed under the action of surface tension forces. The residual particles of the flowable insulation coating 8 and the solder alloy 4 tend to burn off on the electrodes 1 and 1' subsequent to raising the latter from the welded members by virtue of the continuous application of the electric current and heating the electrodes 1 and 1' to a sufficiently high temperature.

The process can be carried out as successfully using other types of electrodes, such a triple electrode, or one V-shaped electrode or a contact-type electrode. The only necessary condition to be complied with is that the electrodes must be withdrawn from the members subsequent to their heating to a temperature which exceeds the melt points of either the flowable insulation coating 8 or the solder alloy 4, depending on which of the two melts the hardest.

Effecting the process of forming a conductive connection according to the method of the invention with at least one of the connectable members having a flowable insulation coating makes it possible to obtain connections featuring high mechanical strength and improved resistance to corrosion due to the layers of the solder alloy 4 and the insulation coating 8 tending to wrap around exposed portions of the conductor.

What is claimed is:

1. A method of forming a conductive connection between predominantly miniature members, at least one of which is coated with a flowable insulation, comprising the steps of:
   pressing said members together and heating them by means of electrodes;
   introducing a solder alloy into the location of said connection between said members;
   application to said electrodes first, second and third current pulses in succession;
   passing through said electrodes said first current pulse to destroy said flowable insulation coating of one of said members in the location of said connection between said members;
   passing through said electrodes and said members said second current pulse to effect a weld between said members;
   application to said electrodes said third current pulse prior to raising said electrodes from said members;
   heating said members to a temperature in excess of the melt points of said solder alloy and flowable insulation coating;
   melting said solder alloy and said flowable insulation coating adjacent to the weld joint formed between said members;
   cleaning said electrodes of said flowable insulation coating;
   withdrawing said electrodes from contact with said members, solder alloy and flowable insulation coating while said solder alloy and flowable insulation coating are in a melted state; and
   quenching said third current pulse after withdrawing said electrodes from said members for cleaning said electrodes of said flowable insulation coating.

* * * * *